(12) United States Patent
Hsieh et al.

(10) Patent No.: US 10,978,269 B2
(45) Date of Patent: Apr. 13, 2021

(54) SAMPLE CHIP FOR ELECTRON MICROSCOPE AND ITS RELATED APPLICATION

(71) Applicant: National Cheng Kung University, Tainan (TW)

(72) Inventors: Po Tsung Hsieh, Tainan (TW); Chung Jen Chung, Tainan (TW); Shih Wen Tseng, Tainan (TW); Chiu Hua Huang, Tainan (TW); Tzu Hsin Chen, Tainan (TW); Ya Wen Tsai, Tainan (TW)

(73) Assignee: NATIONAL CHENG KUNG UNIVERSITY, Tainan (TW)

( * ) Notice: Subject to any disclaimer, the term of this patent is extended or adjusted under 35 U.S.C. 154(b) by 0 days.

(21) Appl. No.: 16/202,061

(22) Filed: Nov. 27, 2018

(65) Prior Publication Data
US 2019/0272972 A1   Sep. 5, 2019

Related U.S. Application Data

(60) Provisional application No. 62/637,816, filed on Mar. 2, 2018.

(30) Foreign Application Priority Data

Oct. 24, 2018   (TW) .................. 107137613

(51) Int. Cl.
*H01J 37/20* (2006.01)
*H01J 37/28* (2006.01)
*H01J 37/26* (2006.01)

(52) U.S. Cl.
CPC ............ *H01J 37/20* (2013.01); *H01J 37/261* (2013.01); *H01J 37/28* (2013.01)

(58) Field of Classification Search
None
See application file for complete search history.

(56) References Cited

U.S. PATENT DOCUMENTS 7,807,979 B2   10/2010   Liu et al.
2009/0166536 A1 *   7/2009   Suga ........................ H01J 37/20
250/307

(Continued)

FOREIGN PATENT DOCUMENTS

JP   2008016249 A   *   1/2008
JP   2016213150 A   *   12/2016
TW   I433195 B       4/2014

*Primary Examiner* — James Choi
(74) *Attorney, Agent, or Firm* — WPAT, PC

(57) ABSTRACT

A sample chip for electron microscope includes a first substrate having a film layer, a buffer layer, and a body layer, a spacing layer positioned below the first substrate, and a second substrate positioned below the spacing layer. The buffer layer is positioned on the film layer and has a buffer opening corresponding to an area of the film layer, the body layer is positioned on the buffer layer and has a body opening corresponding to the buffer opening of the buffer layer to expose the area of the film layer corresponding to the buffer opening, the body layer has a thickness of 10 μm-800 μm, and etching properties of the film layer, the buffer layer, and the body layer are different. A specimen accommodating space is defined in the spacing layer to correspond to the area of the film layer corresponding to the buffer opening.

16 Claims, 10 Drawing Sheets

(56) References Cited

U.S. PATENT DOCUMENTS

2017/0062177 A1* 3/2017 Walden, II .............. H01J 37/26
2018/0136148 A1* 5/2018 Zhang ................ G01N 23/2204

* cited by examiner

SAMPLE CHIP FOR ELECTRON MICROSCOPE AND ITS RELATED APPLICATION

CROSS REFERENCE

This non-provisional application claims benefit of American Provisional Application No. 62/637,816, filed on Mar. 2, 2018, and priority of Taiwan Invention Patent Application No. 107137613, filed on Oct. 24, 2018, the contents thereof are incorporated by reference herein.

FIELD OF THE INVENTION

The present invention is directed to a sample chip for microscope and the application related thereto, and particularly to a sample chip for electron microscope and the application related thereto.

BACKGROUND OF THE INVENTION

As shown in FIG. 18, a specimen kit disclosed in U.S. Pat. No. 7,807,979 includes two substrates (1), two films (2), an adhesive (3), and a specimen cell (4). Each substrate (1) has a window (11), each film (2) is positioned on the corresponding substrate (1), the adhesive (3) is positioned between the two films (2) and has at least one slot, and the specimen cell (4) is formed between the two films (2) for accommodating a specimen.

As shown in FIG. 19, a sample loading device for electron microscope disclosed in Taiwan Invention Patent No. 1433195 includes a cap (5) and a base (6). The cap (5) has a body (51) and a first film (52). The body (51) has a first side and a second side opposite to the first side, the first film (52) is positioned at the second side, the body (51) has a groove (511) formed with an opening at the first side to expose the first film (52) through the groove (511), and a wing portion (512) is horizontally extended from the first side. The base (6) has a substrate portion (61), a welding portion (62), and a second film (63). The substrate portion (61) has an upper edge and a lower edge, the second film (63) is positioned at the lower edge, the substrate portion (61) has a trench (611) formed with another opening at the upper edge to expose the second film (63) through the trench (611), the trench (611) corresponds to the body (51) with respective to their structure to align the second film (63) with the first film (52) in a vertical direction, the welding portion (62) is positioned at the upper edge to correspond to the wing portion (512), and the welding portion (62) is soldered to the cap (5) with a metal composition.

A liquid sample can be loaded in the above-mentioned devices for observation under an electron microscope. However, the window (11) of the substrate (1) is tapered toward the specimen cell (4) (FIG. 18), and the trench (611) of the substrate portion (61) is tapered toward the second film (63) (FIG. 19), which can make the sample-viewing area narrow so as to restrict the device application. For example, the number of the specimen cells is decreased, or only part of the sample is observed.

For these reasons, there is a need to tackle the foregoing problems.

SUMMARY OF THE INVENTION

An objective of the present invention is to provide a sample chip for electron microscope which has a broad sample-viewing area. Accordingly, the application thereof can be enhanced.

Therefore, a sample chip for electron microscope is provided in the present invention, and the sample chip includes a first substrate, a spacing layer, and a second substrate. The first substrate has a film layer, a buffer layer, and a body layer, the buffer layer is positioned on the film layer and has a buffer opening corresponding to an area of the film layer, the body layer is positioned on the buffer layer and has a body opening corresponding to the buffer opening of the buffer layer to expose the area of the film layer corresponding to the buffer opening, the body layer has a thickness of 10 µm-800 µm, and etching properties of the film layer, the buffer layer, and the body layer are different. The spacing layer is positioned below the first substrate and a specimen accommodating space is defined in the spacing layer to correspond to the area of the film layer corresponding to the buffer opening. The second substrate is positioned below the spacing layer.

According to the present invention, the buffer opening and the body opening are both substantially perpendicular with the film layer so that the visual obscuration in the specimen accommodating space resulted from the buffer layer and the body layer can be lowered. By such a manner, a viewing area defined by the specimen accommodating space and the area of the film layer corresponding to the buffer opening is relatively broad so that when the present chip is positioned under an electron microscope to observe a liquid sample or a volatile sample in the specimen accommodating space, more part of the sample can be observed.

The present invention further provides a sample holder for electron microscope, which includes a sample chip as described above and a holder base accommodating the sample chip.

The present invention also provides a sample stage for electron microscope, which includes a sample holder as described above and a stage base accommodating the sample holder.

The present invention yet provides a method for manufacturing a substrate applied to a sample chip for electron microscope, and the method includes the steps of: positioning a buffer layer below a body layer, the body layer having a thickness of 10 µm-800 µm; positioning a film layer below the buffer layer, the film layer, the buffer layer, and the body layer having different etching properties; etching a part of the body layer and a part of the buffer layer to form a body opening and a buffer opening corresponding to the body opening; and etching another part of the buffer layer along the buffer opening to allow the buffer opening to correspond to an area of the film layer and to expose the area of the film layer corresponding to the buffer opening through the body opening.

DETAILED DESCRIPTION OF THE INVENTION

The detailed description and preferred embodiments of the invention will be set forth in the following content, and provided for people skilled in the art so as to understand the characteristics of the invention.

As shown in FIGS. 1-5, a method for manufacturing a sample chip for electron microscope according to an embodiment is depicted. A liquid sample or a volatile sample, e.g. a polishing solution, an emulsion, a cosmetic product, a blood sample, a tissue liquid, a cell culture medium, or a chemical liquid, can be loaded in the sample chip to observe the sample under a scanning electron microscope (SEM) or a transmission electron microscope (TEM).

Figure 1:
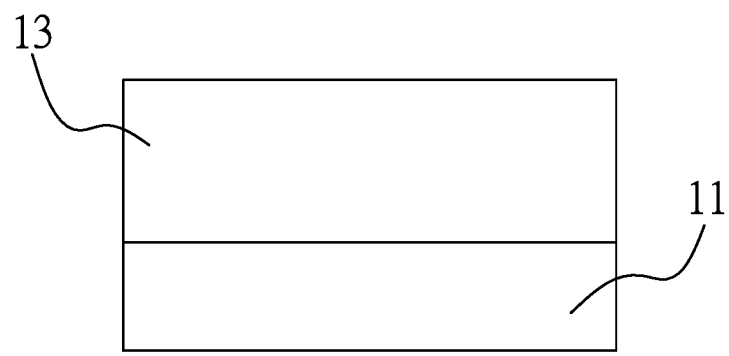
FIGS. 1-5 are schematic views illustrating the manufacture of a sample chip for electron microscope in an embodiment.

In FIG. 1, a buffer layer (11) is deposited below a body layer (13) and the thickness of the body layer (13) is of 10 μm-800 μm. Generally, the buffer layer (11) can be formed below the body layer (13) by means of any deposition method or any epitaxy method, e.g. chemical vapor deposition (CVD), physical vapor deposition (PVD), atomic layer deposition (ALD), or molecular beam epitaxy (MBE). The buffer layer (11) can be removed through the following two different etching procedures. The buffer layer (11) is made of, but not limited to, silicon dioxide or chromium, and has a thickness of, but not limited to, 50 nm-1 μm. The body layer (13) can be removed through the first etching procedure, and is made of, but not limited to, silicon or sapphire.

Figure 2:
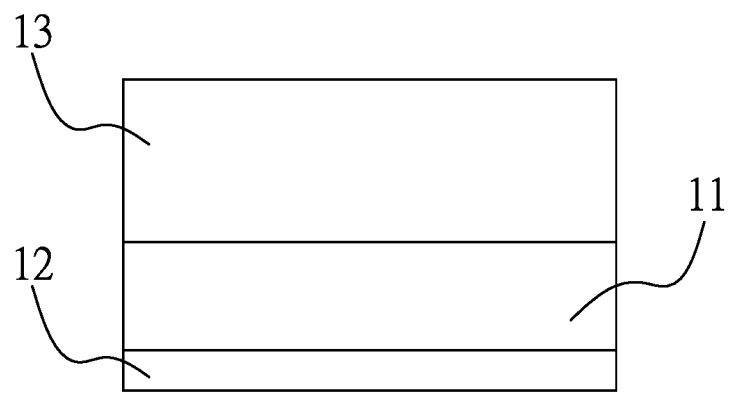

In FIG. 2, a film layer (12) is deposited below the buffer layer (11), and the film layer (12), the buffer layer (11), and the body layer (13) have different etching properties. The phrase "different etching properties" used herein indicates that the individual etching procedure has various etching effects on all layers. Generally, the film layer (12) can be formed below the buffer layer (11) by means of any deposition method or any epitaxy method, e.g. chemical vapor deposition, physical vapor deposition, atomic layer deposition, or molecular beam epitaxy. The film layer (12) can't be removed through the second etching procedure and an electron can penetrate through it. The film layer (12) is made of, but not limited to, silicon nitride or silicon carbide, and has a thickness of, but not limited to, 5 nm-100 nm, preferably 10 nm-50 nm, more preferably 30 nm. Additionally, people skilled in this art can understand that the buffer layer (11) depositing step and the film layer (12) depositing step can be performed in different orders on demand. That is, the buffer layer (11) depositing step is performed and then the film layer (12) depositing step is performed; or the film layer (12) depositing step is performed and then the buffer layer (11) depositing step is performed.

Figure 3:
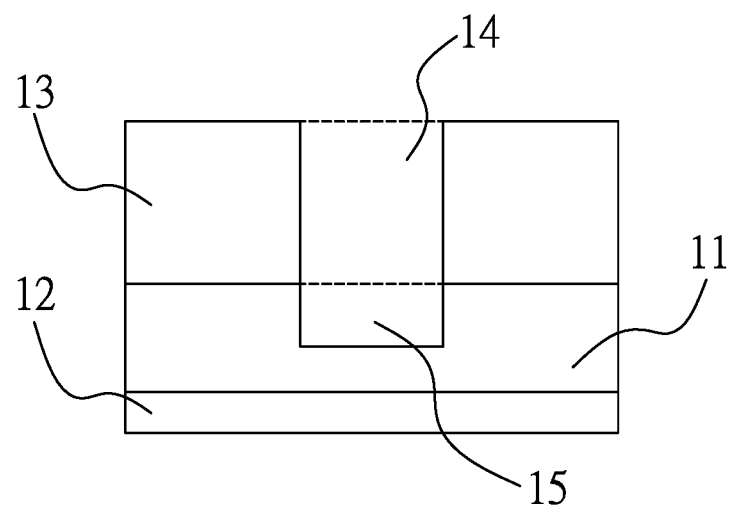

In FIG. 3, a part of the body layer (13) and a part of the buffer layer (11) are etched to form a body opening (14) and a buffer opening (15), and the body opening (14) corresponds to the buffer opening (15). Generally, the body opening (14) and the buffer opening (15) can be formed by means of any etching method, e.g. dry etching or wet etching. The dry etching can be, but not limited to, sputter etching, ion beam etching, plasma etching, or reactive ion etching (RIE); the wet etching can be, but not limited to, buffered oxide etching (BOE), diluted hydrofluoric acid (DHF) etching, thermal hydrofluoric acid etching, thermal phosphoric acid etching, hydrofluoric acid-nitric acid etching, potassium hydroxide etching, hydrofluoric acid-nitric acid-acetic acid-phosphoric acid etching, ammonium hydroxide-hydrogen peroxide etching, hydrofluoric acid etching, or nitric acid etching.

Figure 4:
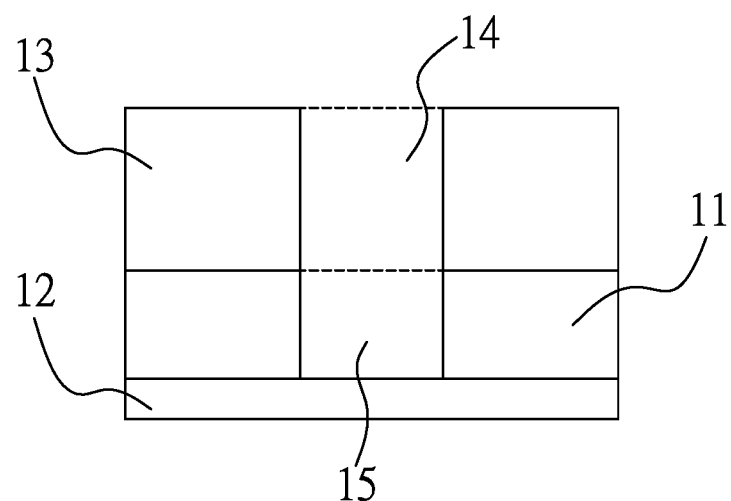

In FIG. 4, another part of the buffer layer (11) is etched along the buffer opening (15) so that the buffer opening (15) corresponds to an area of the film layer (12) and the area of the film layer (12) corresponding to the buffer opening (15) is exposed through the body opening (14). Generally, the area of the film layer (12) corresponding to the buffer opening (15) can be exposed by means of any etching method, e.g. dry etching or wet etching. The dry etching can be, but not limited to, sputter etching, ion beam etching, plasma etching, or reactive ion etching; the wet etching can be, but not limited to, buffered oxide etching, diluted hydrofluoric acid etching, thermal hydrofluoric acid etching, thermal phosphoric acid etching, hydrofluoric acid-nitric acid etching, potassium hydroxide etching, hydrofluoric acid-nitric acid-acetic acid-phosphoric acid etching, ammonium hydroxide-hydrogen peroxide etching, hydrofluoric acid etching, or nitric acid etching.

Figure 5:
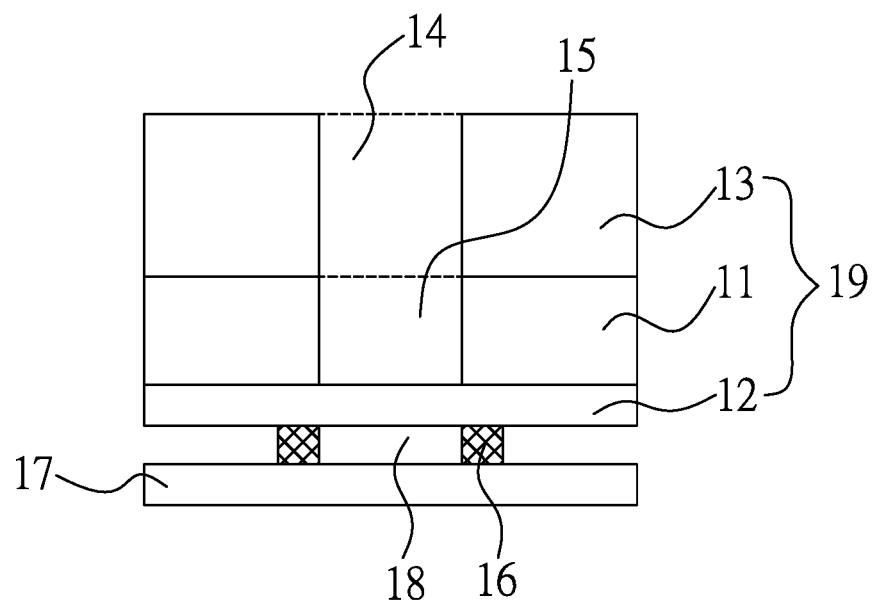

In FIG. 5, a spacing layer (16) and a substrate (17) are respectively deposited below the film layer (12) so that the spacing layer (16) defines a specimen accommodating space (18) corresponding to the area of the film layer (12) corresponding to the buffer opening (15). Thus, the chip is obtained. Since the entity of the film layer (12), the buffer layer (11), and the body layer (13) is deemed another substrate (19), the substrate (19) comprising the film layer (12), the buffer layer (11), and the body layer (13) is called "first substrate" and the substrate (17) deposited below the spacing layer (16) is called "second substrate" for conveniently explaining the following context. As a liquid sample or a volatile sample can be accommodated in the specimen accommodating space (18), the spacing layer (16) has tolerance against the sample (e.g. corrosion tolerance or penetration tolerance). The spacing layer (16) is made of, but not limited to, SU-8 or polyimide (PI), and has a thickness of, but not limited to, 100 nm-100 μm. Furthermore, the detailed structure of the second substrate (17) is not within the spirit and scope of the present invention, and there is no further description of the structure, as long as an electron can penetrate through it. For example, the second substrate (17) can be formed by flipping another substrate as the first substrate (19).

Appropriate etching procedures can be chosen according to the condition of the film layer (12), the buffer layer (11), and the body layer (13) on demand. For example, while the body layer (13) is a silicon layer or a sapphire layer, the buffer layer (11) is a silicon dioxide layer, and the film layer (12) is a silicon nitride layer or a silicon carbide layer, the first etching is dry etching (preferably plasma etching) and the second etching is wet etching (preferably hydrofluoric acid etching). As such, a side surface of the body opening (14) is substantially perpendicular with an adjacent surface of the body layer (13) (preferably, an included angle of 85 degree-95 degree is formed by the two surfaces), and the side surface of the body opening (14) is substantially coplanar with an adjacent side surface of the buffer opening (15) (preferably, an included angle of 170 degree-190 degree is formed by the two surfaces). By such a manner, the side surface of the body opening (14) and the side surface of the buffer opening (15) are both substantially perpendicular with the film layer (12). For further example, while the body layer (13) is a silicon layer or a sapphire layer, the buffer layer (11) is a chromium layer, and the film layer (12) is a silicon nitride layer or a silicon carbide layer, the first etching is dry etching (preferably plasma etching) and the second etching is wet etching (preferably nitric acid etching). As such, a side surface of the body opening (14) is substantially perpendicular with an adjacent surface of the body layer (13) (preferably, an included angle of 85 degree-95 degree is formed by the two surfaces), and the side surface of the body opening (14) is substantially coplanar with an adjacent side surface of the buffer opening (15) (preferably, an included angle of 170 degree-190 degree is formed by the two surfaces). By such a manner, the side surface of the body opening (14) and the side surface of the buffer opening (15) are both substantially perpendicular with the film layer (12).

As above, the visual obscuration in the specimen accommodating space (18) resulted from the buffer layer (11) and the body layer (13) can be lowered. That is, a viewing area defined by the specimen accommodating space (18) and the area of the film layer (12) corresponding to the buffer opening (15) is relatively broad so that when the chip is positioned under an electron microscope to observe a liquid sample or a volatile sample in the specimen accommodating space (18), more part of the sample can be observed. In order to prevent the spacing layer (16) from limiting the viewing area scope, an orthogonal projection region of the specimen accommodating space (18) on the film layer (12) can extend beyond or overlap the area of the film layer (12) corresponding to the buffer opening (15).

Figure 6:
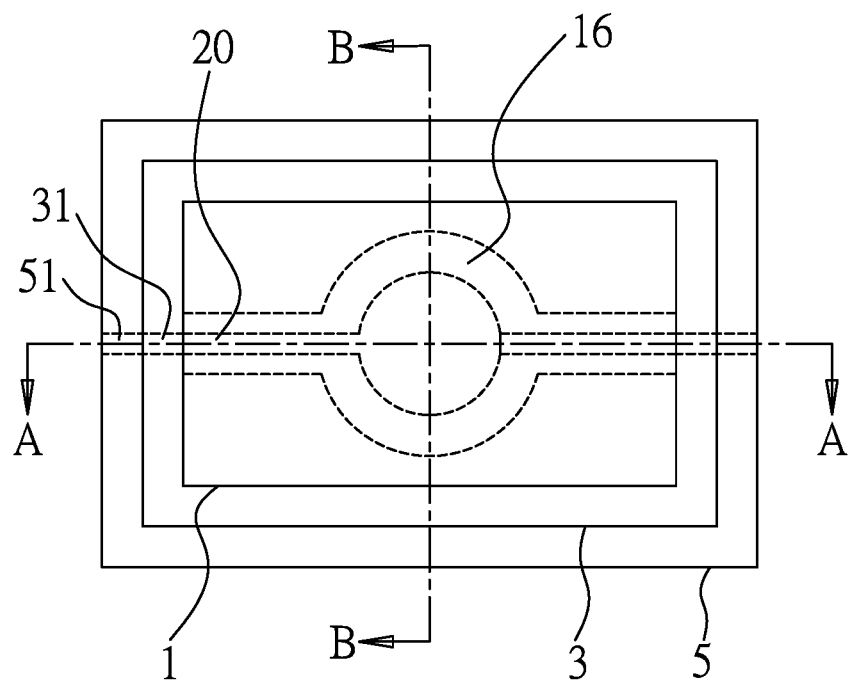
FIG. 6 is a top view illustrating a sample stage for electron microscope in an embodiment.
Figure 7:
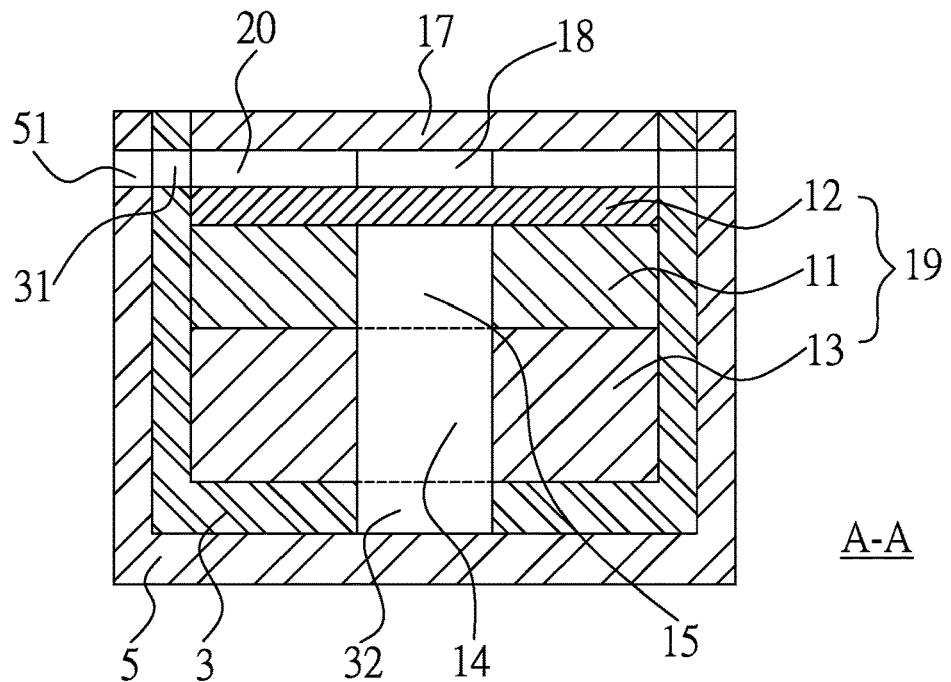
FIG. 7 is a sectional view, taken along line A-A of FIG. 6, illustrating the foregoing sample stage.
Figure 8:
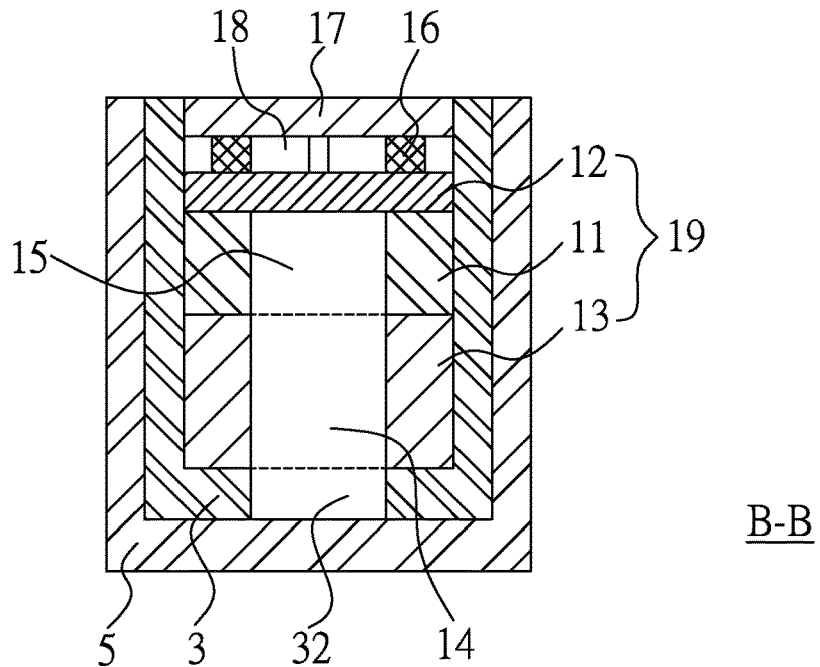
FIG. 8 is a sectional view, taken along line B-B of FIG. 6, illustrating the foregoing sample stage.

As shown in FIGS. 6-8, a sample stage for electron microscope is depicted and it can be used for observing the flow state of a liquid sample or a volatile sample under a scanning electron microscope. The sample stage includes a chip (1), a holder base (3), and a stage base (5).

The chip (1) has structural features as depicted in FIG. 5, and the spacing layer (16) further comprises at least two channels (20) communicating with the specimen accommodating space (18).

The holder base (3) accommodates the chip (1) and has at least two canals (31) communicating with the channels (20) of the chip (1).

The stage base (5) accommodates the holder base (3) and has at least two ditches (51) communicating with the canals (31) of the holder base (3). By such a manner, a pump (not shown) can be connected to the ditches (51) of the stage base (5) to drive the sample to flow in the specimen accommodating space (18).

On another hand, after the holder base (3) and the stage base (5) are separated, the entity of the chip (1) and the holder base (3) (hereafter called "sample holder for electron microscope") can be used for observing the flow state of a liquid sample or a volatile sample under a transmission electron microscope. By such a manner, a pump (not shown) can be connected to the canals (31) of the holder base (3) to drive the sample to flow in the specimen accommodating space (18). In order to let an electron pass through the holder to observe the flow state, the holder base (3) has a via hole (32) corresponding to the area of the film layer (12) corresponding to the buffer opening (15).

On the other hand, the film layer (12) is very thin, and the flow of the sample in the specimen accommodating space (18) can lead to breakage of the area of the film layer (12) corresponding to the buffer opening (15). In order to prevent this breakage, the ditches (51) can be ascendingly and inclinedly connected to the corresponding canals (31); or the canals (31) can be ascendingly and inclinedly connected to the corresponding channels (20); or the channels (20) can be ascendingly and inclinedly connected to the specimen accommodating space (18). The following also can be used to prevent the breakage phenomenon: a diameter of each ditch (51) becomes gradually larger from an end thereof connected to an external region of the stage to another end thereof connected to the corresponding canal (31); or a diameter of each canal (31) becomes gradually larger from an end thereof connected to the corresponding ditch (51) to another end thereof connected to the correspond channel (20); or a diameter of each channel (20) becomes gradually larger from an end thereof connected to the corresponding canal (31) to another end thereof connected to the specimen accommodating space (18).

Figure 9:
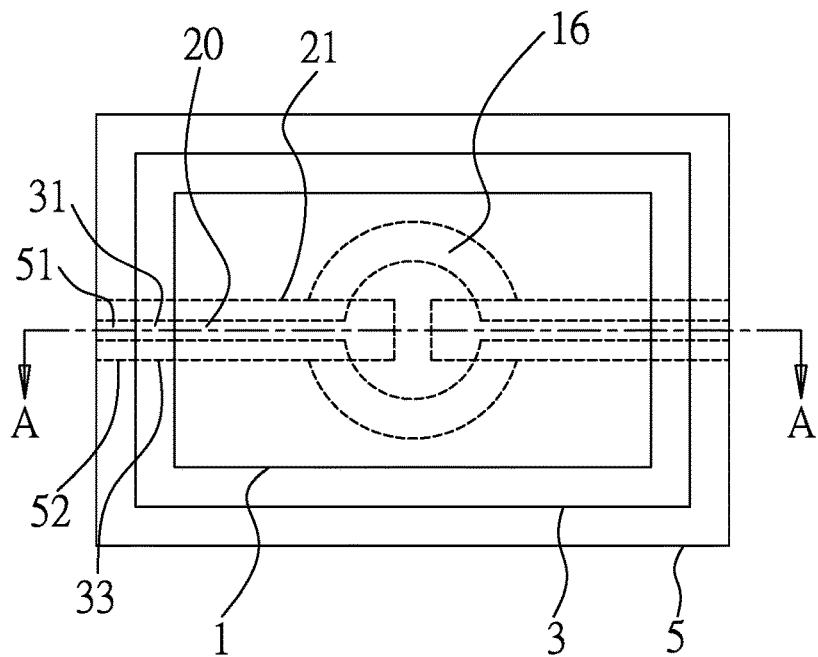
FIG. 9 is a top view illustrating a sample stage for electron microscope in an embodiment.
Figure 10:
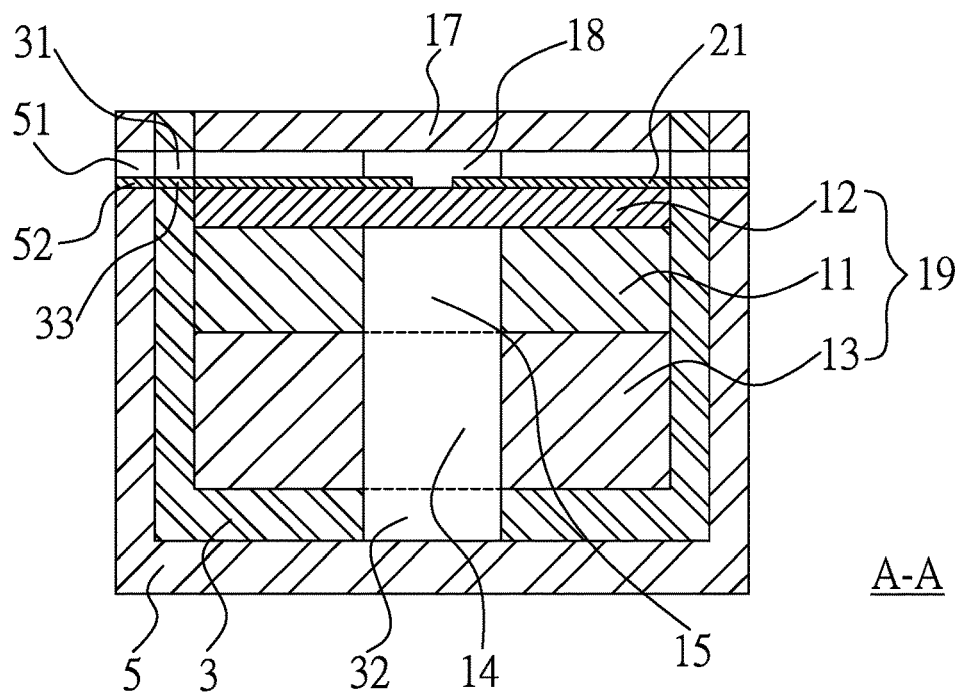
FIG. 10 is a sectional view, taken along line A-A of FIG. 9, illustrating the foregoing sample stage.

As shown in FIGS. 9-10, a sample stage for electron microscope is depicted and it can be used for observing the electrochemical reaction of a liquid sample or a volatile sample under a scanning electron microscope. The sample stage includes a chip (1), a holder base (3), and a stage base (5).

The chip (1) has structural features as depicted in FIG. 5, and at least two electrodes (21) are positioned between the spacing layer (16) and the first substrate (19) or between the spacing layer (16) and the second substrate (17) to communicate with the specimen accommodating space (18). In an example, one of the electrodes (21) is an anode electrode, and the other is a cathode electrode. In another example, one of the electrodes (21) is a working electrode, another is a reference electrode, and the other is an auxiliary electrode.

The holder base (3) accommodates the chip (1) and has at least two conductive connectors (33) electrically connected to the electrodes (21) of the chip (1).

The stage base (5) accommodates the holder base (3) and has at least two electrical connectors (52) electrically connected to the conductive connectors (33) of the holder base (3). By such a manner, a power supply (not shown) can be electrically connected to the electrical connectors (52) of the stage base (5) to provide power for the sample to initiate the electrochemical reaction in the specimen accommodating space (18).

On another hand, after the holder base (3) and the stage base (5) are separated, the entity of the chip (1) and the holder base (3) (hereafter called "sample holder for electron microscope") can be used for observing the electrochemical reaction of a liquid sample or a volatile sample under a transmission electron microscope. By such a manner, a power supply (not shown) can be electrically connected to the conductive connectors (33) of the holder base (3) to provide power for the sample to initiate the electrochemical reaction in the specimen accommodating space (18). Additionally, in order to let an electron pass through the holder to observe the electrochemical reaction, the holder base (3) has a via hole (32) corresponding to the area of the film layer (12) corresponding to the buffer opening (15).

On the other hand, in order to observe the electrochemical reaction taking place near the electrodes (21) under a scanning electron microscope or a transmission electron microscope, an orthogonal projection region of the electrodes (21) on the film layer (12) can extend beyond the area of the film layer (12) corresponding to the buffer opening (15).

Additionally, in order to simultaneously observe the flow state, the chip (1), the holder base (3), and the stage base (5) can further have at least two channels (20), at least two canals (31), and at least two ditches (51) respectively. The channels (20), the canals (31), and the ditches (51) have structural features as shown in FIGS. 6-8, and there is no further description thereof.

Figure 11:
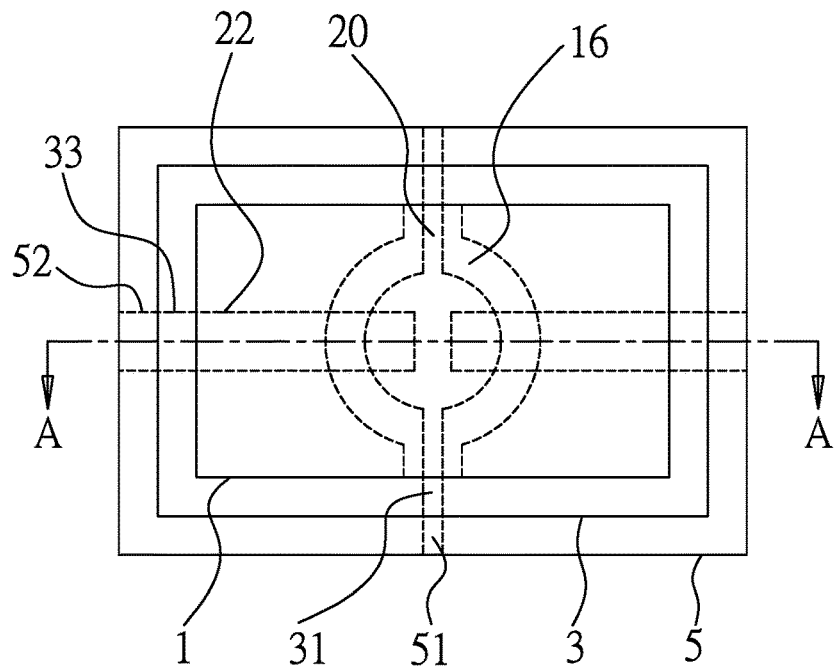
FIG. 11 is a top view illustrating a sample stage for electron microscope in an embodiment.
Figure 12:
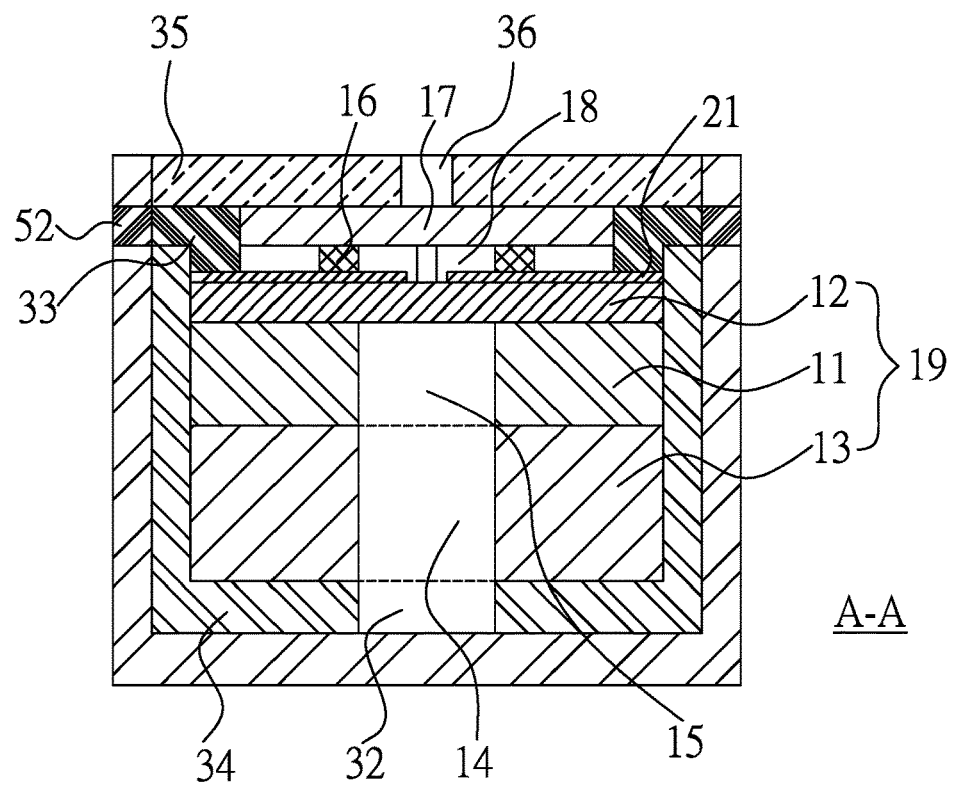
FIG. 12 is a sectional view, taken along line A-A of FIG. 11, illustrating the foregoing sample stage.

As shown in FIGS. 11-12, a sample stage for electron microscope is depicted and it can be used for observing the electrochemical reaction of a liquid sample or a volatile sample under a scanning electron microscope. The sample stage includes a chip (1), a holder base (3), and a stage base (5). The chip (1), the holder base (3), and the stage base (5) not only have structural features as shown in FIGS. 9-10, but also have the structural features as follows:

The substrate (17) positioned away from the holder base (3) (as the second substrate in FIG. 12) has an orthogonal projection region on the substrate (19) positioned toward the holder base (3) (as the first substrate in FIG. 12), and the orthogonal projection region neither extend beyond nor overlap the substrate (19) positioned toward the holder base (3).

The holder base (3) includes a seat (34) and a cap (35). The seat (34) accommodates the chip (1), the cap (35) is covered on the seat (34), and the conductive connectors (33) of the holder base (3) are positioned between the seat (34) and the cap (35) to connect with an upper surface of the electrodes (21) of the chip (1). For letting an electron pass through the holder to observe the electrochemical reaction, the cap (35) has a through hole (36) corresponding to the area of the film layer (12) corresponding to the buffer opening (15).

Figure 13:
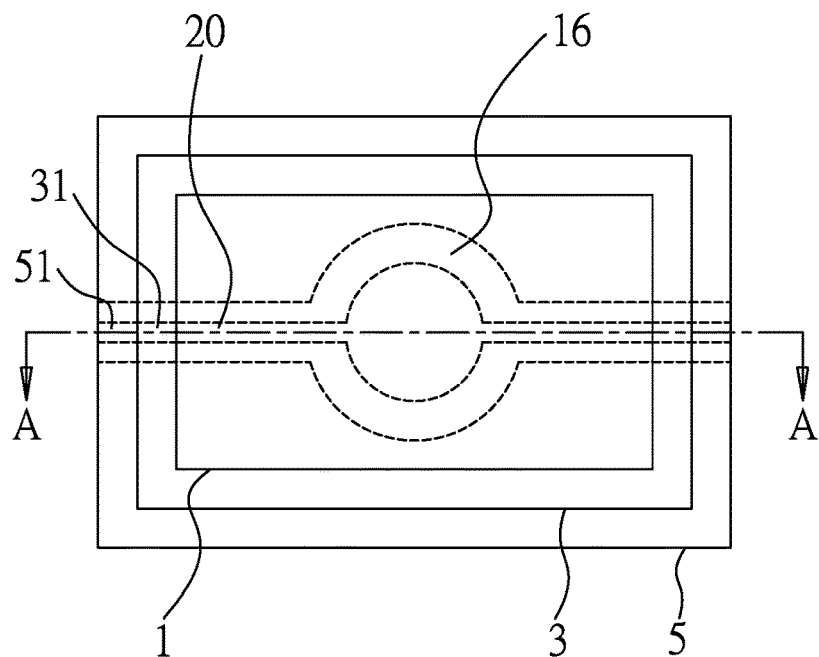
FIG. 13 is a top view illustrating a sample stage for electron microscope in an embodiment.
Figure 14:
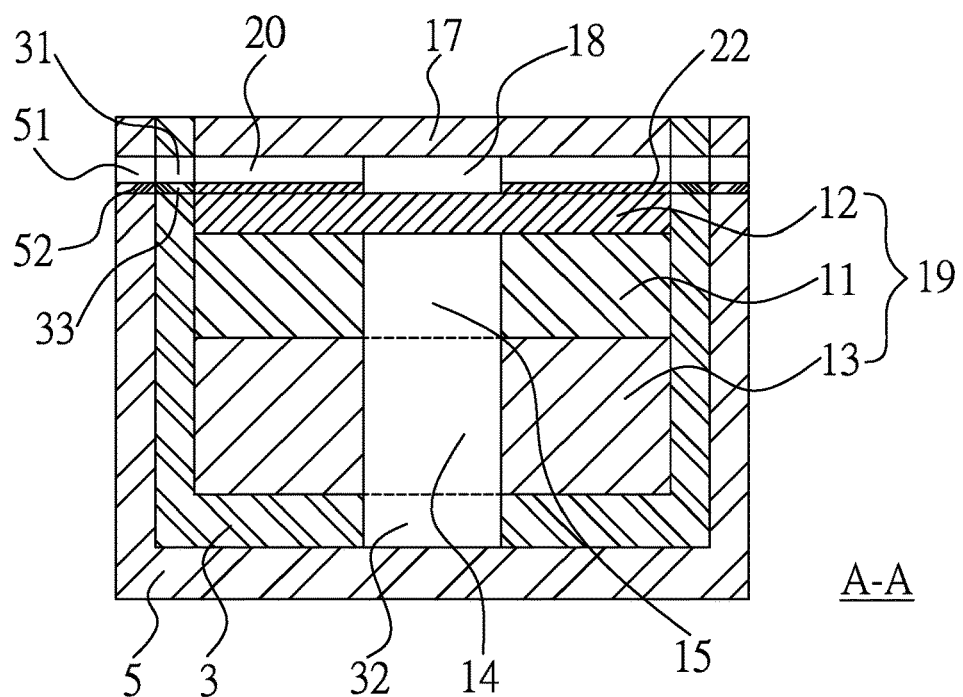
FIG. 14 is a sectional view, taken along line A-A of FIG. 13, illustrating the foregoing sample stage.

As shown in FIGS. 13-14, a sample stage for electron microscope is depicted and it can be used for observing the thermal reaction of a liquid sample or a volatile sample under a scanning electron microscope. The sample stage includes a chip (1), a holder base (3), and a stage base (5).

The chip (1) has the structural features as depicted in FIG. 5, and at least one heater (22) is positioned between the spacing layer (16) and the first substrate (19) or between the spacing layer (16) and the second substrate (17) to communicate with the specimen accommodating space (18).

The holder base (3) accommodates the chip (1) and has at least two conductive connectors (33) electrically connected to the heater (22) of the chip (1).

The stage base (5) accommodates the holder base (3) and has at least two electrical connectors (52) electrically connected to the conductive connectors (33) of the holder base (3). By such a manner, a power supply (not shown) can be electrically connected to the electrical connectors (52) of the stage base (5) to provide power for the sample to initiate the thermal reaction in the specimen accommodating space (18).

On another hand, after the holder base (3) and the stage base (5) are separated, the entity of the chip (1) and the holder base (3) (hereafter called "sample holder for electron microscope") can be used for observing the thermal reaction of a liquid sample or a volatile sample under a transmission electron microscope. By such a manner, a power supply (not shown) can be electrically connected to the conductive connectors (33) of the holder base (3) to provide power for the sample to initiate the thermal reaction in the specimen accommodating space (18). Additionally, for letting an electron pass through the holder to observe the thermal reaction, the holder base (3) has a via hole (32) corresponding to the area of the film layer (12) corresponding to the buffer opening (15).

On the other hand, the film layer (12) is very thin, and the high temperature of the sample in the specimen accommodating space (18) can lead to hot cracking of the area of the film layer (12) corresponding to the buffer opening (15). In order to prevent which, while the heater (22) is positioned between the spacing layer (16) and the first substrate (19), an orthogonal projection region of the heater (22) on the film layer (12) can't extend beyond the area of the film layer (12) corresponding to the buffer opening (15).

Additionally, in order to simultaneously observe the flow state, the chip (1), the holder base (3), and the stage base (5) can further have at least two channels (20), at least two canals (31), and at least two ditches (51) respectively. The channels (20), the canals (31), and the ditches (51) have structural features as shown in FIGS. 6-8, and there is no further description thereof.

Figure 15:
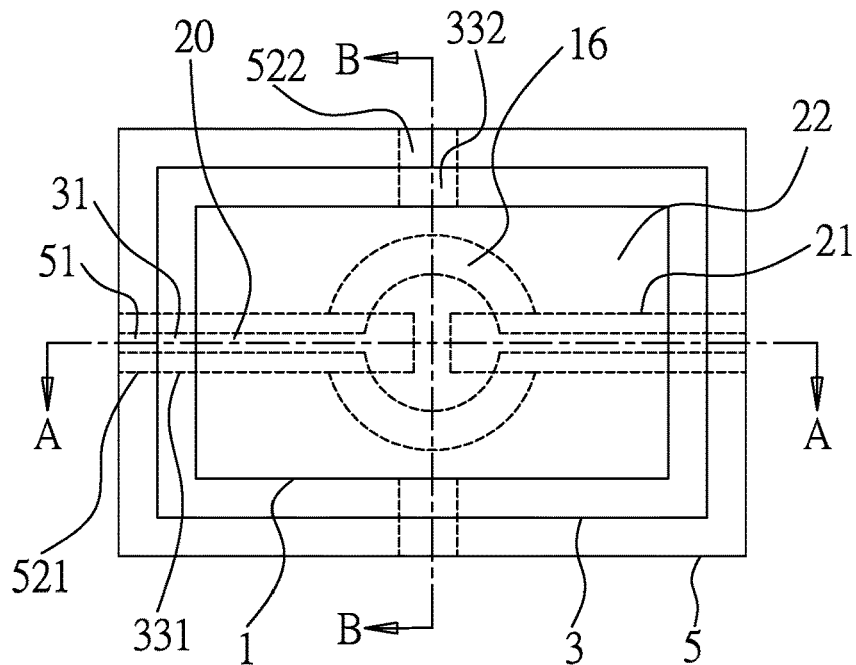
FIG. 15 is a top view illustrating a sample stage for electron microscope in an embodiment.
Figure 16:
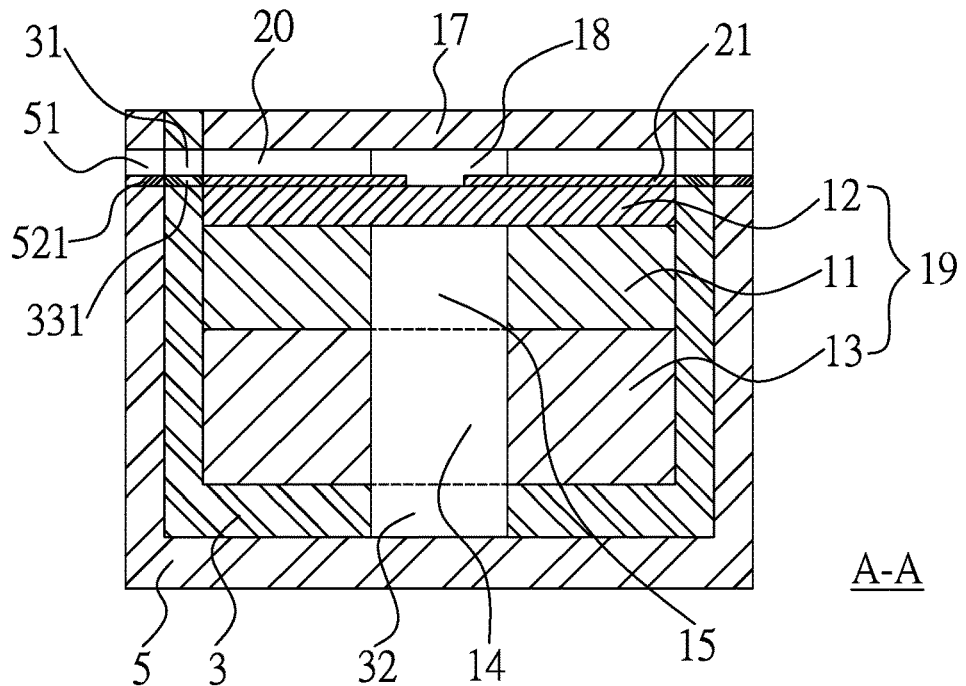
FIG. 16 is a sectional view, taken along line A-A of FIG. 15, illustrating the foregoing sample stage.
Figure 17:
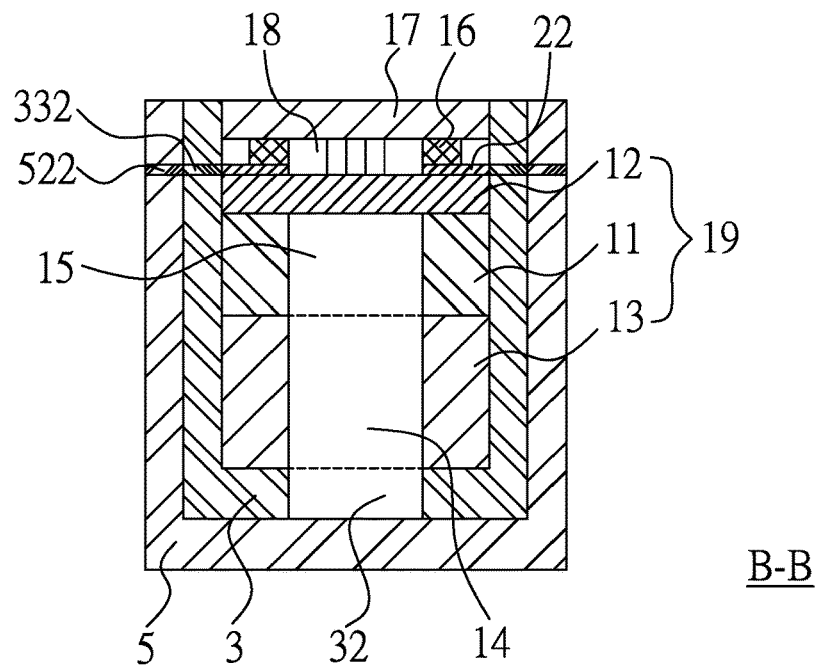
FIG. 17 is a sectional view, taken along line B-B of FIG. 15, illustrating the foregoing sample stage.
Figure 18:
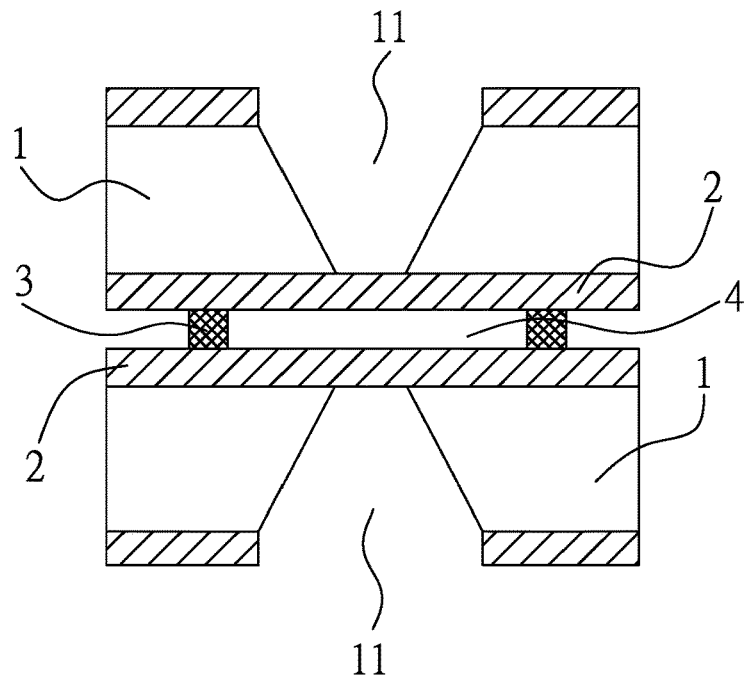
FIG. 18 is a sectional view illustrating the specimen kit of U.S. Pat. No. 7,807,979.
Figure 19:
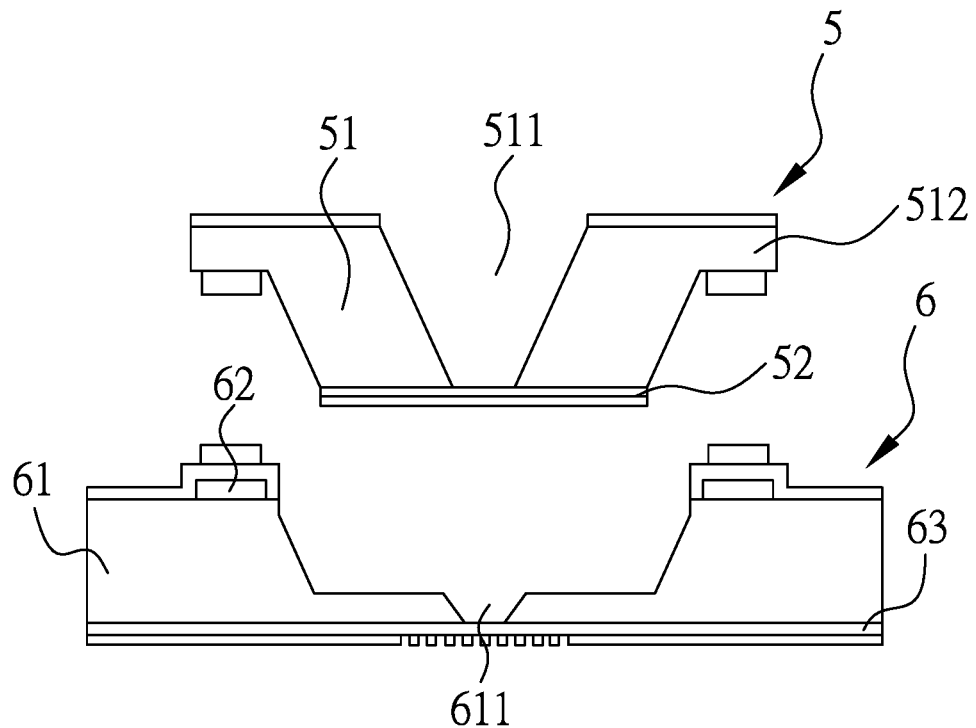
FIG. 19 is a sectional view illustrating the sample loading device for electron microscope of Taiwan Invention Patent No. 1433195.

As shown in FIGS. 15-17, a sample stage for electron microscope is depicted and it can be used for observing the electrochemical reaction and the thermal reaction of a liquid sample or a volatile sample under a scanning electron microscope. The sample stage includes a chip (1), a holder base (3), and a stage base (5).

The chip (1) has the structural features as depicted in FIG. 5, at least two electrodes (21) are positioned between the spacing layer (16) and the first substrate (19) or between the spacing layer (16) and the second substrate (17) to communicate with the specimen accommodating space (18), and a heater (22) is positioned between the spacing layer (16) and the first substrate (19) or between the spacing layer (16) and the second substrate (17) to communicate with the specimen accommodating space (18). In an example, one of the electrodes (21) is an anode electrode, and the other is a cathode electrode. In another example, one of the electrodes (21) is a working electrode, another is a reference electrode, and the other is an auxiliary electrode. Additionally, in order to minimize the chip (1) thickness, while the electrodes (21) and the heater (22) are concurrently positioned between the spacing layer (16) and the first substrate (19) or between the spacing layer (16) and the second substrate (17), the electrodes (21) are coplanar with the heater (22).

The holder base (3) accommodates the chip (1) and has at least two first conductive connectors (331) electrically connected to the electrodes (21) of the chip (1) and at least two second conductive connectors (332) electrically connected to the heater (22) of the chip (1).

The stage base (5) accommodates the holder base (3) and has at least two first electrical connectors (521) electrically connected to the first conductive connectors (331) of the holder base (3) and at least two second electrical connectors (522) electrically connected to the second conductive connectors (332) of the holder base (3). By such a manner, a power supply (not shown) can be electrically connected to the electrical connectors (521 and 522) of the stage base (5) to provide power for the sample to initiate the electrochemical reaction and the thermal reaction in the specimen accommodating space (18).

On another hand, after the holder base (3) and the stage base (5) are separated, the entity of the chip (1) and the holder base (3) (hereafter called "sample holder for electron microscope") can be used for observing the electrochemical reaction and the thermal reaction of a liquid sample or a volatile sample under a transmission electron microscope. By such a manner, a power supply (not shown) can be electrically connected to the conductive connectors (331 and 332) of the holder base (3) to provide power for the sample to initiate the electrochemical reaction and the thermal reaction in the specimen accommodating space (18). Additionally, for letting an electron pass through the holder to observe the electrochemical reaction and the thermal reaction, the holder base (3) has a via hole (32) corresponding to the area of the film layer (12) corresponding to the buffer opening (15).

On the other hand, in order to observe the electrochemical reaction taking place near the electrodes (21) under a scanning electron microscope or a transmission electron microscope, an orthogonal projection region of the electrodes (21) on the film layer (12) can extend beyond the area of the film layer (12) corresponding to the buffer opening (15).

On the other hand, the film layer (12) is very thin, and the high temperature of the sample in the specimen accommodating space (18) can lead to hot cracking of the area of the film layer (12) corresponding to the buffer opening (15). In order to prevent which, while the heater (22) is positioned between the spacing layer (16) and the first substrate (19), an orthogonal projection region of the heater (22) on the film layer (12) can't extend beyond the area of the film layer (12) corresponding to the buffer opening (15).

Additionally, to simultaneously observe the flow state, the chip (1), the holder base (3), and the stage base (5) can further have at least two channels (20), at least two canals (31), and at least two ditches (51) respectively. The channels (20), the canals (31), and the ditches (51) have structural features as shown in FIGS. 6-8, and there is no further description thereof.

While the invention has been described in connection with what is considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What is claimed is:

1. A sample chip for observing a specimen accommodating space with an electron microscope, comprising:
    a first substrate having:
        a film layer;
        a buffer layer positioned directly on the film layer and having a buffer opening with a first opening area size for exposing an area of the film layer, wherein the area of the film layer has the first opening area size; and
        a body layer positioned directly on the buffer layer and having a body opening with the first opening area size for exposing the buffer opening and the area of the film layer, wherein the buffer opening and the body opening are stacked together to form a 90-degree included angle against the film layer, and wherein a 180-degree included angle is formed by the side surface of the body opening and an adjacent side surface of the buffer opening;
    a spacing layer positioned directly below the first substrate and defining the specimen accommodating space with the first opening area size therein to correspond to the shape and area of the film layer, the buffer opening, and body opening; and
    a second substrate positioned directly below the spacing layer;
    wherein the film layer is made of silicon nitride or silicon carbide, the buffer layer is made of silicon dioxide or chromium, and the body layer is made of silicon or sapphire.

2. The sample chip as claimed in claim 1, wherein the film layer has a thickness of 5 nm-100 nm, and the buffer layer has a thickness of 50 nm to 1 µm.

3. The sample chip as claimed in claim 1, wherein the spacing layer has a thickness of 100 nm-100 µm.

4. The sample chip as claimed in claim 1, further comprising:
    at least two channels communicating with the specimen accommodating space.

5. The sample chip as claimed in claim 1, further comprising:
    at least two electrodes positioned between the spacing layer and the first substrate or between the spacing layer and the second substrate to communicate with the specimen accommodating space.

6. The sample chip as claimed in claim 5, wherein an orthogonal projection region of the electrodes on the film layer extends beyond the area of the film layer corresponding to the buffer opening.

7. The sample chip as claimed in claim 1, further comprising:
    at least one heater positioned between the spacing layer and the first substrate or between the spacing layer and the second substrate to communicate with the specimen accommodating space.

8. The sample chip as claimed in claim 7, wherein an orthogonal projection region of the heater on the film layer doesn't extend beyond the area of the film layer corresponding to the buffer opening.

9. The sample chip as claimed in claim 1, further comprising:
    at least two electrodes positioned between the spacing layer and the first substrate or between the spacing layer and the second substrate to communicate with the specimen accommodating space; and
    at least one heater positioned between the spacing layer and the first substrate or between the spacing layer and the second substrate to communicate with the specimen accommodating space.

10. The sample chip as claimed in claim 9, wherein the electrodes are coplanar with the heater.

11. A sample holder for electron microscope, comprising:
    a sample chip as claimed in claim 1; and
    a holder base accommodating the sample chip.

12. The sample holder as claimed in claim 11, wherein the sample chip further comprises at least two channels communicating with the specimen accommodating space; and the holder base further comprises at least two canals communicating with the channels.

13. The sample holder as claimed in claim 11, wherein the sample chip further comprises at least two electrodes positioned between the spacing layer and the first substrate or between the spacing layer and the second substrate to communicate with the specimen accommodating space; and the holder base further comprises at least two conductive connectors electrically connected to the electrodes.

14. The sample holder as claimed in claim 11, wherein the sample chip further comprises at least one heater positioned between the spacing layer and the first substrate or between the spacing layer and the second substrate to communicate with the specimen accommodating space; and the holder base further comprises at least two conductive connectors electrically connected to the heater.

15. The sample holder as claimed in claim 11, wherein the sample chip further comprises at least two electrodes and at least one heater, the electrodes are positioned between the spacing layer and the first substrate or between the spacing layer and the second substrate to communicate with the specimen accommodating space, and the heater is positioned between the spacing layer and the first substrate or between the spacing layer and the second substrate to communicate with the specimen accommodating space; and the holder base further comprises at least two first conductive connectors and at least two second conductive connectors, the first conductive connectors are electrically connected to the electrodes, and the second conductive connectors are electrically connected to the heater.

16. The sample chip as claimed in claim 1, wherein the body layer has a thickness of 10 μm-800 μm.

* * * * *